United States Patent
Sharma et al.

(10) Patent No.: US 12,105,174 B2
(45) Date of Patent: Oct. 1, 2024

(54) TECHNIQUE FOR DETERMINING A CARDIAC METRIC FROM CMR IMAGES

(71) Applicant: SIEMENS HEALTHINEERS AG, Forchheim (DE)

(72) Inventors: Puneet Sharma, Princeton Junction, NJ (US); Lucian Mihai Itu, Brasov (RO)

(73) Assignee: Siemens Healthineers AG, Forchheim (DE)

(*) Notice: Subject to any disclaimer, the term of this patent is extended or adjusted under 35 U.S.C. 154(b) by 413 days.

(21) Appl. No.: 17/446,223

(22) Filed: Aug. 27, 2021

(65) Prior Publication Data
US 2022/0082647 A1  Mar. 17, 2022

(30) Foreign Application Priority Data

Sep. 17, 2020 (EP) .................................. 20465558

(51) Int. Cl.
*G01R 33/563* (2006.01)
*G01R 33/567* (2006.01)
*G06N 3/08* (2023.01)

(52) U.S. Cl.
CPC ..... *G01R 33/56366* (2013.01); *G01R 33/567* (2013.01); *G06N 3/08* (2013.01)

(58) Field of Classification Search
CPC ... G01R 33/56366; G01R 33/567; G06N 3/08
See application file for complete search history.

(56) References Cited

U.S. PATENT DOCUMENTS

| | | | |
|---|---|---|---|
| 11,094,061 B1* | 8/2021 | Min | A61B 6/463 |
| 2016/0166209 A1* | 6/2016 | Itu | A61B 6/5217 |
| | | | 600/408 |
| 2019/0005384 A1* | 1/2019 | Sundar | G06N 3/084 |
| 2019/0087726 A1* | 3/2019 | Greenblatt | G06N 3/08 |
| 2019/0355118 A1* | 11/2019 | Zilberstien | A61B 6/5217 |

(Continued)

OTHER PUBLICATIONS

Filev et al., "Long-Term Prognostic Value of Stress Perfusion Cardiovascular Magnetic Resonance Imaging," 2019, Current Treatment Options Cardiovasc Med., vol. 21, No. 10), p. 51.

(Continued)

*Primary Examiner* — Dixomara Vargas

(57) ABSTRACT

A technique for determining a cardiac metric from rest and stress perfusion cardiac magnetic resonance (CMR) images is provided. A neural network system for determining at least one cardiac metric from CMR images comprises an input layer configured to receive at least one CMR image representative of a rest perfusion state and at least one CMR image representative of a stress perfusion state. The neural network system further comprises an output layer configured to output at least one cardiac metric based on the at least one CMR image representative of the rest perfusion state and the at least one CMR image representative of the stress perfusion state. The neural network system with interconnections between the input layer and the output layer is trained by a plurality of datasets. Each of the datasets comprises an instance of the at least one CMR image representative of the rest perfusion state and the at least one CMR image representative of the stress perfusion state for the input layer and the at least one cardiac metric for the output layer.

24 Claims, 6 Drawing Sheets

(56) References Cited

U.S. PATENT DOCUMENTS

| | | | |
|---|---|---|---|
| 2021/0015438 A1* | 1/2021 | Sahbaee Bagherzadeh | G16H 50/20 |
| 2021/0319558 A1* | 10/2021 | Min | A61B 6/032 |
| 2022/0392065 A1* | 12/2022 | Min | A61B 6/032 |
| 2023/0038493 A1* | 2/2023 | Villongco | A61B 5/055 |

OTHER PUBLICATIONS

Foley et al., "A comparison of cardiovascular magnetic resonance and single photon emission computed tomography (SPECT) perfusion imaging in left main stem or equivalent coronary artery disease: a CE-MARC substudy," 2017, Journal Cardio-vasc Magn Reson, vol. 19, Article No. 84, 9 pgs.

Klem et al., "Improved detection of coronary artery disease by stress perfusion cardiovascular magnetic resonance with the use of delayed enhancement infarction imaging," 2006, J Am Coll Cardiol, 47(8), pp. 1630-1638.

Heydari et al., "Stress Perfusion Cardiac Magnetic Resonance Imaging Effectively Risk Stratifies Diabetic Patients With Suspected Myocardial Ischemia," 2016, Circulation: Cardiovascular Imaging, vol. 9, No. 4, 12 pgs.

Engblom et al., "Fully quantitative cardiovascular magnetic resonance myocardial perfusion ready for clinical use: a comparison between cardiovascular magnetic resonance imaging and positron emission tomography," 2017, Journal of Cardiovascular Magnetic Resonance, vol. 19, No. 78, 9 pgs.

Cerqueira at al., "Standardized myocardial segmentation and nomenclature for tomographic imaging of the heart. A statement for healthcare professionals from the Cardiac Imaging Committee of the Council on Clinical Cardiology of the American Heart Association," 2002, Circulation, vol. 105, No. 4, pp. 539-542.

Cookson at al., "A novel porous mechanical framework for modelling the interaction between coronary perfusion and myocardial mechanics," 2012, Journal of Biomechanics, vol. 45, Issue 5, pp. 850-855.

Wu et al., "A Comprehensive Survey on Graph Neural Networks," 2021, IEEE Transactions on Neural Networks and Learning Systems, vol. 32, Issue: 1, 22 pgs., https://arxiv.org/pdf/1901.00596.pdf.

Zhu et al., "Unpaired Image-to-Image Translation using Cycle-Consistent Adversarial Networks," 2017, Proceedings of the IEEE International Conference on Computer Vision (ICCV), pp. 2223-2232, https://arxiv.org/abs/1703.10593.

Van de Hoef et al., "Physiological basis and long-term clinical outcome of discordance between fractional flow reserve and coronary flow velocity reserve in coronary stenoses of intermediate severity," 2014, Circulation: Cardiovascular Interventions, vol. 7, Issue 3, pp. 301-311.

Misra et al., "Cross-Stitch Networks for Multi-task Learning," 2016, Proceedings of the IEEE Conference on Computer Vision and Pattern Recognition (CVPR), pp. 3994-4003.

Cipolla et al., "Multi-task Learning Using Uncertainty to Weigh Losses for Scene Geometry and Semantics," 2018, Proceedings of the IEEE Conference on Computer Vision and Pattern Recognition (CVPR), pp. 7482-7491.

Ratner et al., "Data Programming: Creating Large Training Sets, Quickly," 2016, 30th Conference on Neural Information Processing Systems (NIPS 2016), 9 pgs., https://arxiv.org/abs/1605.07723.

Scannell, et al., "Deep-Learning-Based Preprocessing for Quantitative Myocardial Perfusion MRI"; In: J. Magn. Reson. Imaging; 2020; vol. 51:1689-1696.

Lundervold, et al., "An overview of deep learning in medical imaging focusing onMRI"; In: Zeitschrift für Medizinische Physik; 2019; vol. 29; Issue 2, pp. 102-127.

Nakajima, Kenichi et al: "Diagnostic performance of artificial neural network for detecting ischemia in myocardial perfusion imaging"; In: Circulation Journal; vol. 79; 2015; pp. 1549-1556; ISSN 1347-4820 (E); 1346-9843 (P); DOI: 10.1253/circj.CJ-15-0079; URL: https://www.jstage.jst.go.jp/article/circj/79/7/79 CJ_15_0079/_pdf/-char/ja.

Itu, Lucian et al: "A machine-learning approach for computation of fractional flow reserve fromcoronary computed tomography"; In: J Appl Physiol; 2016; vol. 121; pp. 42-52; doi: 10.1152/japplphysiol.00752.2015.20.

* cited by examiner

TECHNIQUE FOR DETERMINING A CARDIAC METRIC FROM CMR IMAGES

This application claims priority to German Patent Application No. 102020211643.1, filed Sep. 17, 2020, and European Patent Application No. 20465558.3, filed Sep. 17, 2020, the disclosures of which are incorporated herein by reference in their entirety.

TECHNICAL FIELD

The present disclosure relates to a technique for determining a cardiac metric from rest and stress perfusion cardiac magnetic resonance (CMR) images. More specifically, and without limitation, a neural network system, a method and a computer program product are provided for a lesion-specific coronary artery disease (CAD) assessment by means of artificial intelligence (AI) using rest and stress perfusion CMR imaging.

BACKGROUND

Perfusion cardiac magnetic resonance (CMR) imaging is an effective test to assess the myocardial blood flow at rest and at stress, thereby making it a highly accurate technique for the assessment of coronary artery disease (CAD).

Despite its accuracy, CMR imaging is not widely used in clinical practice for the assessment of CAD due to long scan times, lack of standardization in examination protocols, lack of standardization in post-processing, and lack of direct comparison with invasively measured fractional flow reserve (FFR), which is conventionally considered as the gold standard in clinical decision making for non-culprit coronary stenoses. The current state of the art is, e.g., summarized by P. D. Filev and A. E. Stillman in "Long-Term Prognostic Value of Stress Perfusion Cardiovascular Magnetic Resonance Imaging", Curr Treat Options Cardiovasc Med. 2019 Aug. 31; 21(10):51.

Another drawback is that in case of multi-vessel disease, it is difficult to isolate lesion-specific information from perfusion CMR imaging, e.g. by conventional visual assessment as discussed by James R. J. Foley et al. in "A comparison of cardiovascular magnetic resonance and single photon emission computed tomography (SPECT) perfusion imaging in left main stem or equivalent coronary artery disease: a CE-MARC substudy", J Cardiovasc Magn Reson. 2017; 19: 84.

Conventionally, the stress and rest perfusion CMR examinations are read and/or interpreted visually by a clinician to assess the existence of a perfusion deficit (qualitative assessment). I. Klem et al., for example, propose a qualitative visual interpretation algorithm combining Delayed Enhancement-CMR (DE-CMR) with rest and stress perfusion CMR data in "Improved detection of coronary artery disease by stress perfusion cardiovascular magnetic resonance with the use of delayed enhancement infarction imaging", J Am Coll Cardiol. 2006 Apr. 18; 47(8):1630-8.

In certain instances, a semi-quantitative assessment of relative perfusion distribution is performed, as discussed in view of non-invasive cardiac risk profiling for diabetic patients by B. Heydari et al. in "Stress Perfusion Cardiac Magnetic Resonance Imaging Effectively Risk Stratifies Diabetic Patients With Suspected Myocardial Ischemia", Circ Cardiovasc Imaging. 2016 April; 9(4):e004136.

More recently, techniques for a fully quantitative assessment (also referred to as absolute quantification) that perform pixel-wise quantification of perfusion images have been established to calculate quantities such as myocardial blood flow (MBF) or myocardial blood volume (MBV), which according to H. Engblom et al. in "Fully quantitative cardiovascular magnetic resonance myocardial perfusion ready for clinical use: a comparison between cardiovascular magnetic resonance imaging and positron emission tomography", J Cardiovasc Magn Reson. 2017; 19: 78, however, requires a preceding manual delineation of endocardial and epicardial borders.

The orientation of the heart, naming of cardiac planes, number of segments of the left ventricle (LV), common display, and regional nomenclature and locations for a variety of cardiac imaging modalities, including e.g. CMR, conventionally follow the American Heart Association (AHA) segmentation model presented by M. D. Cerqueira at al. in "Standardized myocardial segmentation and nomenclature for tomographic imaging of the heart. A statement for healthcare professionals from the Cardiac Imaging Committee of the Council on Clinical Cardiology of the American Heart Association", Circulation. 2002 Jan. 29; 105(4):539-42.

Head-to-head comparison with invasively measured FFR has been successfully performed in several recent clinical trials. However, lesion-specific information is typically not available by any method for post-processing CMR perfusion examinations.

BRIEF SUMMARY OF THE INVENTION

Accordingly, there is a need for a technique that enables a lesion-specific coronary artery disease (CAD) assessment using rest and stress perfusion cardiac magnetic resonance (CMR) imaging. Alternatively or in addition, it is an objective to provide a technique for determining and/or quantifying one or more clinical metrics from rest and stress perfusion CMR images without human expertise and/or human assessment.

As to a first aspect, a neural network system for determining at least one cardiac metric from CMR images is provided. The neural network system comprises an input layer configured to receive at least one CMR image representative of a rest perfusion state and at least one CMR image representative of a stress perfusion state. The neural network system further comprises an output layer configured to output at least one cardiac metric based on the at least one CMR image representative of the rest perfusion state and the at least one CMR image representative of the stress perfusion state. The neural network system with interconnections between the input layer and the output layer is trained by a plurality of datasets. Each of the datasets comprises an instance of the at least one CMR image representative of the rest perfusion state and the at least one CMR image representative of the stress perfusion state for the input layer. Each of the datasets further comprises an instance of the (e.g. associated) at least one cardiac metric for the output layer.

The at least one CMR image representative of the rest perfusion state may be shortly denoted as rest perfusion CMR image. Alternatively or in addition, the at least one CMR image representative of the stress perfusion state may shortly be denoted as stress perfusion CMR image. Both rest and stress perfusion CMR states may relate to the same patient. The stress perfusion CMR state may be measured within a drug induced stress state, e.g. by administering adenosine to the patient. The rest and stress perfusion CMR images may be collected at one appointment, e.g. within 30 minutes and/or 1 or few hours and/or using the same magnetic resonance device (e.g. CMR device) or the same magnetic resonance scanner (e.g. CMR scanner).

The at least one CMR image representative of the rest and/or the stress perfusion state may comprise a stack of cine (e.g. a time sequence of) CMR slices. Alternatively or in addition, the at least one CMR image representative of the rest and/or the stress perfusion state may comprise a plurality of CMR images relating to a full cardiac cycle. A cardiac cycle may comprise an end-diastolic (ED) state and an end-systolic (ES) state. Alternative or in addition, the at least one CMR image representative of the rest and/or the stress perfusion state may comprise an average of CMR images taken over a full cardiac cycle.

The at least one cardiac metric may comprise hemodynamic indices and/or metrics related to a myocardial size and/or elasticity (for example based on a wall motion) and/or a wall motion pattern.

The at least one cardiac metric may comprise, relate to, or imply one or more hemodynamic indices (e.g., rheological measurands). The one or more hemodynamic indices may comprise at least one of a fractional flow reserve (FFR), an instantaneous flow reserve (IFR), a distal intracoronary and/or aortic pressure (Basal Pd/Pa), a diastolic hyperemia-free ratio (DFR), a coronary flow reserve (CFR), an index of microcirculatory resistance (IMR), a hyperemic stenosis resistance (HSR) and/or a basal stenosis resistance (BSR).

A value of the FFR may correspond to a hyperemic state invasively measured at stress, e.g. after the administration of adenosine. Basal Pd/Pa may correspond to the rest state of the patient. Mathematically, FFR and basal Pd/Pa may be computed with the same formula, but they represent different patient states, in particular at stress and at rest, respectively.

Alternatively or in addition, the at least one cardiac metric may comprise at least one of a linear size (e.g., a length of a secant) e.g. of a heart chamber, a volume (or volumetric size) e.g. of a heart chamber, a mass e.g. of a heart chamber, a myocardial elasticity e.g. of a heart chamber, and a motion pattern e.g. of a heart chamber (for example corresponding to a wall motion pattern).

The linear size may comprise a (e.g. time-dependent) diameter of (e.g. the blood pool of) the left ventricle (LV) and/or the right ventricle (RV) and/or the thickness of the LV wall and/or the RV wall. Alternatively or in addition, the volumetric size may comprise an (e.g. time-dependent) volume of the LV and/or the RV and/or an ejection fraction (EF) of the LV (LV-EF) and/or of the RV (RV-EF). The time-dependency of the volume may relate to an end-systolic (ES) volume and/or an end-diastolic (ED) volume. Alternatively or in addition, the myocardial elasticity or motion pattern may comprise a (e.g. regional) wall motion pattern or a (e.g. regional) wall motion score index (WMSI). Herein, 'regional' or 'local' may relate to a (e.g., spatial or functional) segmentation of the heart, e.g. pursuant to the AHA segmentation model.

The datasets (also referred to as training data) may be comprised in a training database. The training database may comprise a plurality of manually annotated real CMR images taken on a plurality of patients. The at least one cardiac metric of the training database may be manually determined by one or more observers (also: trained experts or clinicians). Alternatively or in addition, the training database may comprise synthetic datasets. The synthetic datasets may be based on deformations from and/or re-parametrization of real datasets (e.g., using a coronary artery anatomical model).

The technique, particularly the neural network system, may be computer-implemented.

By determining one or more cardiac metrics from stress perfusion CMR images and rest perfusion CMR images using a neural network system, a precise quantitative assessment of cardiac function and/or of lesion-specific cardiac dysfunction is facilitated. The precise quantitative assessment may be obtained promptly and/or rapidly after the recording of the rest perfusion CMR images and the stress perfusion CMR images after the neural network system has been trained for the outputting of a given cardiac metric (also briefly denoted as a task).

The at least one cardiac metric may comprise a hemodynamic index. Alternatively or in addition, the at least one cardiac metric may comprise a linear size of a heart chamber, optionally a thickness of a heart wall. Further alternatively or in addition, the at least one cardiac metric may comprise a volumetric size of a heart chamber. Still further alternatively or in addition, the at least one cardiac metric may comprise a mass of a heart chamber. Even further alternatively or in addition, the at least one cardiac metric may comprise a myocardial elasticity and/or a measure of myocardial motion pattern (e.g. wall motion pattern).

The myocardial elasticity may comprise or may be based on a (e.g., regional or local) wall motion and/or the (e.g., regional or local) wall motion pattern of the wall motion. The wall motion may be quantified and/or labeled by a wall motion score index (WMSI). The WMSI may comprise the values 1, 2, 3 and 4 for normal, hypokinesia, akinesia and dyskinesia, respectively. Alternatively or in addition, a regional WMSI may relate to one or more segments of the (e.g., spatial or functional) segmentation of the heart (e.g., according to the AHA segmentation model). The (e.g., total) WMSI may be determined by the ratio of the sum of all regional WMSIs to the number of related segments.

The at least one hemodynamic index may comprise at least one of an FFR, an IFR and a distal intracoronary pressure (Pd) and an aortic pressure (Pa), optionally a ratio (Pd/Pa) thereof. Alternatively or in addition, the at least one hemodynamic index may comprise at least one of a DFR, a CFR, an IMR, a HSR, and a BSR.

The input layer of the neural network system may be further configured to receive at least one image representative of late gadolinium enhancement (LGE). Alternatively or in addition, the input layer of the neural network system may be further configured to receive data representative of a prior medical examination. Still further alternatively or in addition, the input layer of the neural network system may be further configured to receive at last one further CMR image representative of a strain analysis.

The data representative of a prior medical examination may, e.g., comprise an assessment of an echocardiography and/or a cardiac Positron Emission Computed Tomography (PET) and/or a cardiac Single-Photon Emission Computed Tomography (SPECT). Alternatively or in addition, the data representative of a prior medical examination may comprise an (e.g. stress) electrocardiogram (ECG), and/or a visual assessment by an expert or clinician.

The output layer of the neural network system may be configured to output at least two different cardiac metrics. For example, the neural network system with interconnections between the input layer and the output layer may be trained to output at least two different cardiac metrics by multi-task learning using the plurality of datasets. Each of the datasets may comprise an instance of the at least one CMR image representative of the rest perfusion state and the at least one CMR image representative of the stress perfusion state for the input layer. Each of the datasets may further comprise an instance of the (e.g. associated to the CMR images) at least two different cardiac metrics for the output layer.

The multi-task learning and/or the at least two different cardiac metrics may comprise a pixel-wise output of the at least one cardiac metric. Pixels of the pixel-wise output may correspond to pixels of the at least one CMR image representative of the rest perfusion state and the at least one CMR image representative of the stress perfusion state.

Herein, 'pixel' may encompass two-dimensional pixels of the CMR images. Alternatively or in addition, 'pixel' may encompass three-dimensional voxels of the CMR images.

Alternatively or in addition, the multi-task learning and/or the at least two different cardiac metrics may comprise a segment-wise output of the at least one cardiac metric. Segments of the segment-wise output may correspond to a (e.g., spatial or functional) segmentation of myocardium based on the at least one CMR image representative of the rest perfusion state and on the at least one CMR image representative of the stress perfusion state.

Further alternatively or in addition, the multi-task learning and/or the at least two different cardiac metrics may comprise an output of the at least one cardiac metric for each of the main coronary arteries. The main coronary arteries may comprise the left anterior descending artery (LAD), the left circumflex artery (LCx) and the right coronary artery (RCA).

The pixel-wise and/or segment-wise output of the at least different cardiac metrics (e.g. two values of the same hemodynamic index pertaining to different cardiac regions) may be a lesion-specific information of the heart and/or may comprise spatial information.

Still further alternatively or in addition, the multi-task learning and/or the at least two different cardiac metrics may comprise a patient-wise output of the at least two different cardiac metrics. The patient-wise output may comprise a joint classification of the at least two different cardiac metrics.

A patient-wise joint classification of two different cardiac metrics may also be denoted as binary classification. Alternatively or in addition, a patient-wise joint classification of at least two cardiac metrics may be also denoted as functional assessment of at least two different cardiac metrics (e.g. two different hemodynamic indices such as FFR and CFR). The functional assessment may comprise identifying a region within a two-dimensional plot of the two different cardiac metrics (e.g. two different hemodynamic indices such as FFR and CFR).

For example, if at least one regional FFR value is lower than 0.8, then the patient is considered to be positive (i.e., the patient has a significant CAD). If all regional FFR values are greater than 0.8, the patient is negative (i.e., no significant CAD).

Any embodiment using the linear and/or volumetric size of a heart chamber and/or the mass of a heart chamber as a cardiac metric may determine a single measure of each one (linear and/or volumetric size and/or mass) per patient.

Any embodiment using a wall motion analysis (or a wall motion pattern) and/or an elasticity, may determine (e.g. analogously to different regional FFR values) if one (e.g., at least one) segment of the segmentation indicates a functionally significant CAD, the patient-wise output is considered to be positive and/or as 'significant CAD'. Otherwise, if all segments are healthy, the patient-wise output is considered to be negative.

Any embodiment of the patient-wise output of the at least two different cardiac metrics (e.g. two different hemodynamic indices such as FFR and CFR) may output a lesion-specific information of the heart comprising functional information. For example, the functional information may be indicative of predominantly microvasculature being involved in the CAD, if the value of FFR is normal and the value of CFR for the same patient is abnormal.

The neural network system may comprise at least two sub-networks corresponding to the at least two different cardiac metrics. The interconnections may comprise cross-connections between the at least two sub-networks at the input layer. Alternatively or in addition, the interconnections may comprise cross-connections between the input layer and at least one hidden layer and/or cross-connections between at least two hidden layers. Further alternatively or in addition, the interconnections may comprise cross-connections between the input layer and the output layer.

The different sub-networks and/or the cross-connections between the sub-networks may result from the multi-task learning.

The at least two different cardiac metrics may comprise a FFR and a CFR. A joint classification of the CFR and the FFR may correspond to a lesion-specific classification of CADs at the output layer.

The CFR may also be denoted as coronary flow velocity reserve (CFVR).

Training the neural network system and/or outputting of each of the at least two different cardiac metrics may comprise assigning a different labeling function to each of the at least two different cardiac metrics.

Different labeling functions may correspond to different tasks (e.g. determining different cardiac metrics as outputs) of the multi-task learning. A training label may correspond to an output value of a labeling function (e.g. an annotation corresponding to a real dataset of rest and stress perfusion CMR images used for training the neural network system with interconnections).

The labeling function for a cardiac metric may comprise determining the output of the cardiac metric based on the input rest and stress perfusion CMR images. Each labeling function may be specific to the cardiac metric to be determined and/or to be output. Alternatively or in addition, each cardiac metric to be determined and/or to be output may have one or more labeling functions assigned. Determining and/or outputting a (e.g. specific) cardiac metric may be denoted as (e.g. specific) task.

Each of the labeling functions may comprise an abstain value. The abstain value may be assigned if no input data are available for the labeling function. For example, the abstain value may be assigned for a labeling function using one or more images representative of LGE as input if no LGE images of the patient were taken. Alternatively or in addition, the abstain value may be assigned if the output does not comprise a decisive value.

The abstain value of the labeling function may relate to a task that is not performed for every patient. For example, a prior medical examination may not have taken place. Alternatively or in addition, the abstain value may be assigned if the output does not comprise a decisive value. For example, the abstain value may be assigned if a major adverse cardiac event (MACE) can neither be confirmed nor, e.g. definitely, be excluded by the output. Herein, MACE may refer to any cardiac event requiring medical attention, comprising amongst others myocardial infarction and/or death.

The interconnections of the neural network system may comprise at least one hidden layer for jointly processing the at least one CMR image representative of the rest perfusion state and the at least one CMR image representative of the stress perfusion state for outputting at least two different cardiac metrics. The at least one hidden layer for jointly processing may be consecutive to the input layer receiving the at least one CMR image representative of the rest perfusion state and the at least one CMR image representative of the stress perfusion state. Optionally, the at least one hidden layer may comprise a convolutional layer.

Alternatively or in addition, the interconnections of the neural network system may comprise at least two hidden layers for separately (e.g. per cardiac metric) processing the at least one CMR image representative of the rest perfusion state and the at least one CMR image representative of the stress perfusion state for outputting at least two different cardiac metrics. The at least two hidden layers for separately processing (e.g. per cardiac metric) may be subject to a similarity constraint. Alternatively or in addition, the at least two hidden layers for separately processing (e.g. per cardiac metric) may have approximately the same distance from the output layer. The distance from the output layer may be measured as the minimal number of interconnections of or among the different layers.

Further alternatively or in addition, the interconnections of the neural network system may comprise at least two hidden layers for processing the at least one CMR image representative of the rest perfusion state and the at least one CMR image representative of the stress perfusion state for outputting at least two different cardiac metrics. A first hidden layer may process the at least one CMR image representative of the rest perfusion state and the at least one CMR image representative of the stress perfusion state for a first cardiac metric. A second hidden layer may process the at least one CMR image representative of the rest perfusion state and the at least one CMR image representative of the stress perfusion state for a second cardiac metric. The processing at the second hidden layer (e.g. for determining the second cardiac metric) may further comprise using the output of the first hidden layer (e.g. the determined first cardiac metric) as input in addition to the input of the at least one CMR image representative of the rest perfusion state and the at least one CMR image representative of the stress perfusion state.

The at least one hidden layer for jointly processing a given set of rest and stress perfusion CMR images to output at least two different cardiac metrics may be denoted as hard parameter sharing sub-network.

The at least two hidden layers for separately processing a given set of rest and stress CMR images to output at least two different cardiac metrics may be denoted as soft parameter sharing and/or as cross-stitching sub-networks. The soft parameter sharing and/or the cross-stitching sub-networks may also be denoted as sibling networks.

A hard parameter sharing sub-network may be followed by a plurality of soft parameter sharing and/or cross-stitching sub-networks (e.g. for outputting a plurality of different cardiac metrics).

The output layer may comprise at least one parallel layer for any given one of the at least two different cardiac metrics. The parallel output layers may also be denoted as task specific heads.

Having the processing of a second hidden layer depend on the output of a first hidden layer (e.g. in addition to the processing of the second hidden layer depend on the output of the input layer) may be denoted as cascaded model.

The training of the neural network system with interconnections and/or the outputting of at least one cardiac metric may comprise a coronary artery anatomical model and/or a coronary perfusion model. The training may comprise at least one of the following steps: adapting the coronary artery anatomical model to anatomical images; mapping of the adapted coronary artery anatomical model to the at least one CMR image representative of the rest perfusion state and the at least one CMR image representative of the stress perfusion state; determining of at least one hemodynamic index of at least one main coronary artery; and determining a perfusion of myocardium using the coronary perfusion model.

The coronary artery anatomical model may comprise and/or represent the large epicardial coronary arteries. Alternatively or in addition, the coronary perfusion model may comprise and/or represent the perfusion of small arteries and/or capillaries of the myocardium with blood. The coronary perfusion model may use information computed from the coronary artery anatomical model as input.

The anatomic images may comprise images acquired via angiography, e.g., cardiac computed tomography angiography (CCTA) and/or X-ray angiography. The adapted coronary artery anatomical model may relate to a patient.

The main artery may comprise at least one of the LAD, LCx and RCA.

The neural network system may comprise a graph neural network (GNN).

A graph may be used to represent in a structured form the relationship between the different segments of the AHA segmentation model. Alternatively or in addition, the pixels of CMR images may correspond to nodes, e.g. representing neurons of the input layer, of a graph of the GNN. The GNN may be a graph convolutional neural network (graph CNN). A graph CNN may be a special type of CNN that can process graphs.

The plurality of datasets may comprise real datasets and synthetic datasets. The training may comprise generating the synthetic datasets.

The synthetic datasets may be generated by means of a generative adversarial network (GAN). The GAN may be a cycle GAN. Generating synthetic data may comprise a style transfer. A probability density of the synthetic datasets (e.g., as a function of the at least one cardiac metric) may be complementary to a probability density of the real datasets.

As to a second aspect, a method of determining at least one cardiac metric from CMR images using a neural network system is provided. The method comprises the step of receiving, at an input layer, at least one CMR image representative of the rest perfusion state and at least one CMR image representative of the stress perfusion state. The method further comprises the step of outputting, at an output layer, at least one cardiac metric based on the at least one CMR image representative of the rest perfusion state and the at least one CMR image representative of the stress perfusion state. The method further comprises training the neural network system with interconnections between the input layer and the output layer by a plurality of datasets. Each of the datasets comprises an instance of the at least one CMR image representative of the rest perfusion state and the at least one CMR image representative of the stress perfusion state for the input layer. Each of the datasets further comprises an instance of the (e.g. associated) at least one cardiac metric for the output layer.

The method may further comprise one or more steps for the training and/or for the outputting of the at least one cardiac metric using the neural network system according to or corresponding to any feature disclosed in the context of the first and/or the neural network system aspect.

As to a third aspect, a computer program product is provided. The computer program product comprises program code portions for performing any one of the steps of the second and/or the method aspect, when the computer program product is executed on one or more computing devices comprising a neural network system. Optionally, the computer program product may be stored on a computer-readable medium. The computer program product may also be provided for download, e.g., via a radio or cellular network, the Internet and/or a host computer. Alternatively, or in addition, the method may be encoded in a Field-Programmable Gate Array (FPGA) and/or an Application-Specific Integrated Circuit (ASIC), or the functionality may be provided for download by means of a hardware description language.

BRIEF DESCRIPTION OF THE DRAWINGS

Further details of embodiments of the technique are described with reference to the enclosed drawings, wherein.

DETAILED DESCRIPTION

In the following description, for purposes of explanation and not limitation, specific details are set forth, such as a neural network system comprising a plurality of hidden layers in order to provide a thorough understanding of the technique disclosed herein. It will be apparent to one skilled in the art that the technique may be practiced in other embodiments that depart from these specific details.

Figure 1:
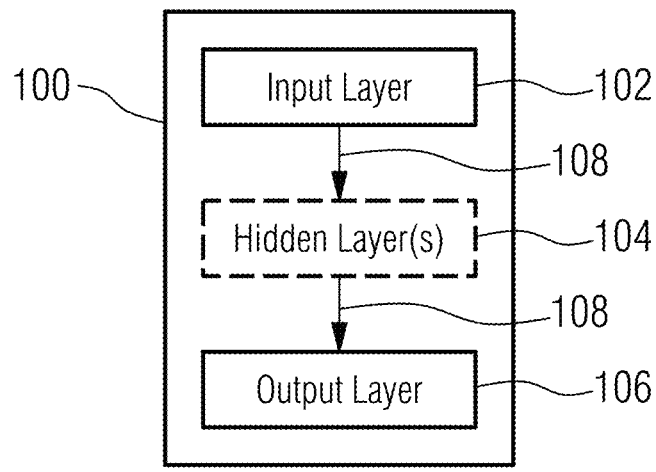
FIG. 1 shows an example schematic block diagram of a neural network system for determining a cardiac metric from rest and stress perfusion CMR images.

FIG. 1 schematically illustrates an example block diagram of a neural network system for determining a cardiac metric from rest perfusion CMR images and stress perfusion CMR images (briefly: 'rest and stress perfusion CMR images'). The neural network system is generally referred to by reference sign 100.

The neural network system 100 comprises an input layer 102 that is configured to receive one or more CMR images representative of a rest perfusion state and one or more CMR images representative of a stress perfusion state.

The neural network system 100 further comprises an output layer 106 that is configured to output one or more cardiac metrics based on the one or more CMR images representative of the rest perfusion state and the one or more CMR images representative of the stress perfusion state.

The neural network system 100 optionally comprises one or more hidden layers 104 between the input layer 102 and the output layer 106.

The neural network system 100 further comprises interconnections 108 between the input layer 102 and the output layer 106. Optionally, the interconnections 108 may run through one or more hidden layers 104.

The neural network system 100 with interconnections 108 is trained by a plurality of datasets. Each of the datasets comprises an instance of one or more rest perfusion CMR images and one or more stress perfusion CMR images for the input layer 102 and at least one cardiac metric for the output layer 106.

Figure 2:
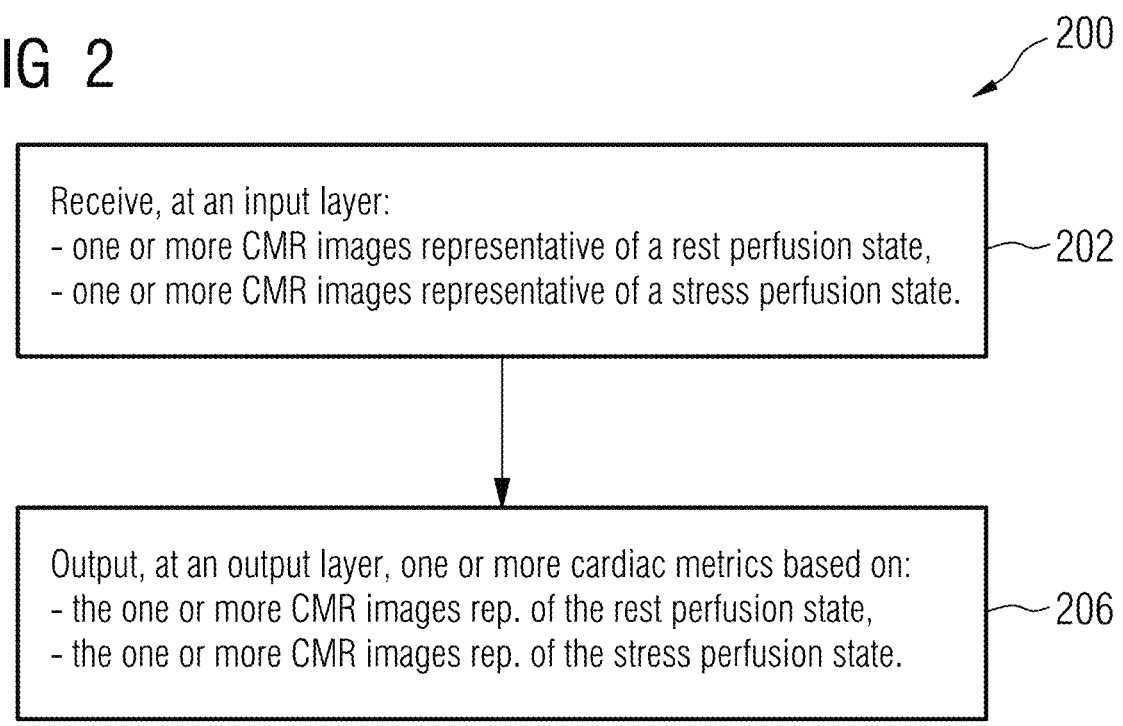
FIG. 2 shows an example flowchart of a method for determining a cardiac metric from rest and stress perfusion CMR images using a neural network system, which neural network system may be implementable by the neural network system of FIG. 1.

FIG. 2 schematically illustrates an example flowchart for a method 200 for determining a cardiac metric from rest and stress perfusion CMR images. The method 200 comprises or initiates a step 202 of receiving, at an input layer, one or more CMR images representative of a rest perfusion state and one or more CMR images representative of a stress perfusion state. The method 200 further comprises or initiates a step 206 of outputting, at an output layer, one or more cardiac metrics based on the one or more CMR images representative of the rest perfusion state and one or more CMR images representative of the stress perfusion state.

The method 200 may be performed by the neural network system 100. For example, the input layer 102 and the output layer 106 may perform the receiving step 202 and the outputting step 206, respectively. Intermediate steps of determining the at least one cardiac metric may be performed by one or more hidden layers 104.

By the method 200, a novel approach for analyzing perfusion CMR images allows for a lesion-specific non-invasive assessment of CAD.

Figure 3:
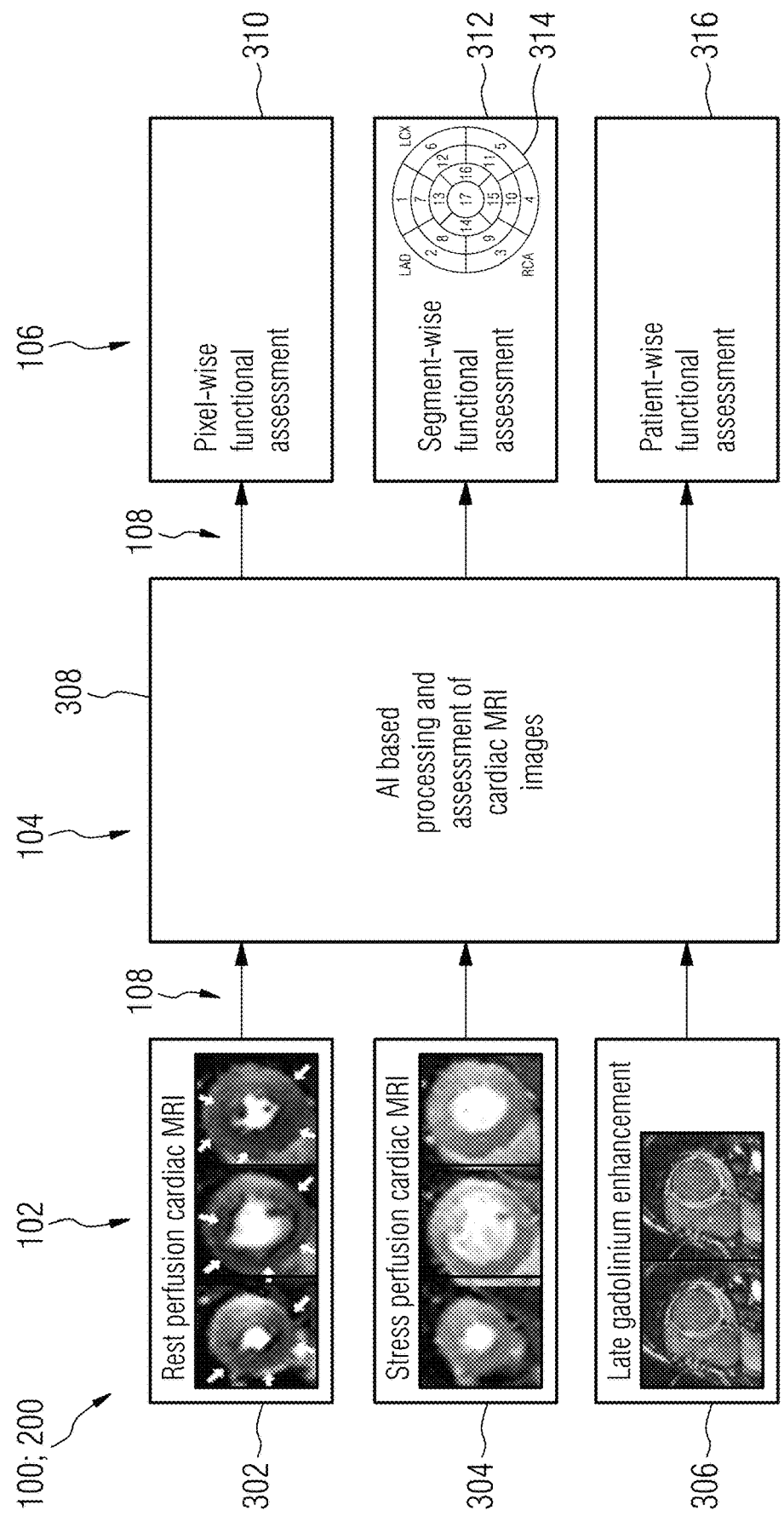
FIG. 3 shows an example flowchart of a method for determining one or more cardiac metrics from rest and stress perfusion CMR images and optionally from LGE images using a neural network system, which neural network system may be implementable by the neural network system of FIG. 1.

An example of the method 200 for determining one or more cardiac metrics based on one or more artificial intelligence models is shown in FIG. 3. The example method 200 uses, at the input layer 102, as first input data one or more rest perfusion CMR images at reference sign 302, which may optionally comprise and/or encode one or more absolute cardiac perfusion values at a patient rest state, and as second input data one or more stress perfusion CMR images at reference sign 304, which may optionally comprise and/or encode one or more absolute cardiac perfusion values at a patient stress state. Optionally, the input data may further comprise images indicative of LGE at reference sign 306. Further optionally, the input data (not shown) may comprise data related to a prior medical examination and/or related to a strain analysis performed on other (e.g. regular) CMR images (e.g. apical 2D+t images).

The output, at the output layer 106, of the artificial intelligence (AI) based processing and assessment 308 of the rest and stress perfusion CMR images 302 and 304, respectively, and optionally the LGE images 306 and/or further input data, e.g. by means of one or more hidden layers 104 and interconnections 108 of the neural network system 100, comprises one or more cardiac metrics. As an example, the one or more cardiac metrics may be indicative and/or representative of one or more (e.g. coronary) hemodynamic indices allowing for a functional assessment of CAD. The (e.g. coronary) hemodynamic indices may for example comprise FFR, IFR, basal Pd/Pa, DFR, CFR, IMR, HSR or BSR.

A multi-task learning approach (also: 'multi-task learning framework') may perform the assessment 308 using a pixel-wise assessment 310. E.g. the assessment can be reported pixel-wise directly on the input rest and stress perfusion CMR images 302 and 304, respectively. Alternatively or in addition, the multi-task learning approach may perform the assessment 308 segment-wise as displayed at reference sign 312, e.g. using the 17 segments of the AHA segmentation model. Further alternatively or in addition, the multi-task learning approach may perform the assessment 308 per main coronary artery (LAD, LCx, RCA), as exemplified at reference sign 314 for LCx associated to the segments numbered 5, 6, 11, 12 and 16 of the 17 segments of the AHA segmentation model, since there is a direct correspondence between the segments and the coronary arteries. Still further alternatively or in addition, the multi-task learning approach may perform the assessment 308 patient-wise as depicted at reference sign 316, e.g. by reporting the functionally most significant hemodynamic index value(s) for the patient. For example FFR and CFR may be jointly assessed for a patient.

All outputs in the multi-task learning approach are optional.

Specifically, in an advantageous implementation, data programming may be employed within the multi-task learning framework. A. Ratner et al. for example describe in "Data Programming: Creating Large Training Sets, Quickly", https://arxiv.org/abs/1605.07723 data programming for machine learning (ML) using labeling functions, with each labeling function corresponding to one task.

Only a part of the tasks may focus on the functional assessment of CAD (e.g. using one or more hemodynamic indices such as FFR and/or CFR), while others may focus on different related tasks. Related task may, e.g., comprise internal linear measurements of the LV (e.g. a diameter) and/or (e.g. a thickness) of one or more LV walls. Alternatively or in addition, related tasks may comprise volumetric measurements such as a time-varying volume, an end-systolic volume, an end-diastolic volume or an ejection fraction (EF), in particular of the LV (LV-EF). Further alternatively or in addition, a related task may comprise determining an LV mass. Still further alternatively or in addition, a related task may comprise a regional wall motion analysis. A wall motion score index (WMSI) may be assigned to each segment, e.g. of the AHA segmentation model, with the WMSI based on the systolic function of the segment (comprising, e.g., 'normal'=1, 'hypokinesis'=2, 'akinesia'=3, 'dyskinesia'=4). The, e.g. total, WMSI may be determined and/or calculated by dividing the sum of the (e.g. local) WMSIs of each segment by the total number of segments. Ground truth information may be defined based on expert annotations performed by visual analysis. Different variations between different states are expected to be encountered for stable and acute CAD patients.

By forcing the neural network system 100 to learn one or more related tasks, the performance obtained on the main task of interest, e.g. the functional assessment of CAD using one or more hemodynamic indices, may increase. For example, noisy training labels may be exploited by specifically encoding a weak supervision in the form of labeling functions. Labeling functions may have widely varying error rates and may conflict on certain data points. Labeling functions may be modeled as a generative process, leading to an automated denoising by learning the accuracies of the labeling functions along with their correlation structure. A labeling function need not have perfect accuracy or recall. Rather, a labeling function may represent a pattern that the user wishes to impart to his/her model and that is easier to encode as a labeling function than as a set of hand-labeled (e.g. annotated by a medical expert) examples.

Labeling functions may be based on external knowledge bases, libraries or ontologies, may express heuristic patterns, or some hybrid of these types. The use of labeling functions may also (e.g. strictly) be more general than manual annotations. A manual annotation may (e.g. always) be directly encoded by a labeling function. Labeling functions may overlap, conflict, and even have dependencies which users may provide as part of the data programming specification.

A sub-network, e.g. of the neural network system 100, addressing the main task of functional assessment of CAD, e.g. using one or more hemodynamic indices, may use as input the outputs of all (e.g. comprising all other) tasks.

Multiple labeling functions may be defined for the main task, e.g. functional assessment of CAD, based on at least one of the following data employing a respective threshold (for example during training of the neural network system 100): one or more invasively measured hemodynamic indices, a clinical decision, a patient outcome (e.g. based on follow-up information) and a WMSI (e.g. transformed to a binary label).

Some of the values of the labeling functions are typically not available for all patients. One of the advantages of the above defined approach (e.g. for training the neural network system 100) is that for each labeling function one can also assign an 'abstain' value. For example, for the labeling function defined based on the patient outcome, it may either have a positive label (in case the patient has had a MACE) or an 'abstain' label in case the follow-up period is not very large, and hence a definitive negative label cannot be assigned.

Different formulations may be employed for the multi-task learning approach. In a first embodiment, the multi-task learning approach comprises hard parameters sharing. The neural network system 100 may comprise one main network with task specific heads, wherein the neural network system 100 uses a joint representation. In a second embodiment, which is combinable with the first embodiment, the multi-task learning approach comprises soft parameters sharing. The neural network system 100 may comprise multiple 'sibling' networks whose (e.g. hidden) layers are constrained to be similar, followed by task specific heads. In a third embodiment, which is combinable with any other embodiment, the multi-task learning approach comprises several independent and/or cascaded sub-networks and/or models.

In a first embodiment, the neural network system 100 (also denoted as 'AI model') may be trained directly on one or more invasively measured FFR values. The FFR value(s) may be measured at one location, at multiple locations or at a continuum of locations as obtained by performing a pullback measurement.

In a second embodiment, which is combinable with any other embodiment, the neural network system 100 may be trained using a physics-based approach, comprising at least one of the following steps: In a first step, a coronary artery anatomical model is reconstructed from medical images (e.g. CCTA and/or X-ray Angiography of a patient). In a second step, the coronary artery anatomical model is mapped to the rest and stress perfusion CMR images (e.g. of the same patient). In a third step, a computational fluid dynamics (CFD) and/or AI based approach is employed to determine and/or compute one or more hemodynamic indices in at least one of the coronary arteries. In a fourth step, the perfusion of the myocardium is determined and/or computed using a (e.g. coronary) perfusion model. For example, absolute perfusion values are obtained. The coronary artery anatomical model and/or perfusion model may, e.g., correspond to and/or be part of the framework presented by A. N. Cookson at al. in "A novel porous mechanical framework for modelling the interaction between coronary perfusion and myocardial mechanics", J Biomech. 2012 Mar. 15; 45(5): 850-855.

In a third embodiment, which is combinable with any other embodiment of the neural network system 100, a CMR polar plot may be represented as a graph. The graph may represent in a structured form the relationship between the different segments of the AHA segmentation model (e.g. mapping the structure of the main coronary arteries). The graph representation may allow for superior prediction performance, since additional hierarchical information may be present. Different types of neural network system 100 and/or AI models may also be employed in this case, e.g. comprising a graph CNN. A review of different types of graph CNNs can for example be found in Zonghan Wu et al. "A Comprehensive Survey on Graph Neural Networks", https://arxiv.org/pdf/1901.00596.pdf.

In a fourth embodiment, which is combinable with any other embodiment of the neural network system 100 disclosed herein, the rest and stress perfusion CMR image data may be employed for a superior personalization of a physics and/or AI based non-invasive determination and/or computation of one or more hemodynamic indices (e.g. CT based FFR and/or angiography based FFR). One of the difficulties in the non-invasive determination and/or computation of hemodynamic indices is that the flow in the coronary arteries cannot be measured and must be estimated. Conventionally, the estimation may be done reliably using allometric scaling laws and surrogate measurements, but under certain pathological conditions (e.g. undetected microvascular disease), large differences between the estimated and the actual values of the hemodynamic indices may be obtained. These uncertainties in the estimates may, according to the present invention, advantageously be resolved by using the rest and stress perfusion CMR image data for a superior personalization of the (e.g. coronary artery anatomic and/or perfusion) model employed for determining the stress and/or rest hemodynamic indices.

For example, by performing a mapping between the perfusion data and the main coronary arteries, a stress and/or rest myocardial blood flow value may be associated to each main coronary artery. The knowledge of the myocardial blood flow values allows for a precise estimation of the microvascular resistance of each main coronary artery, which in turn allows for a precise determination of hemodynamic indices using CFD and/or deep learning (DL) based approaches (e.g. by means of the neural network system 100).

The approach may also be useful in case of post-myocardial infarction (MI) assessment. MI can lead to necrosis, e.g. myocardial scars. Necrosis may lead to a reduction of the flow demand in the infarcted area and/or infarcted volume. The precise extent of the infarction is difficult to estimate non-invasively, e.g. using solely CCTA or angiography data. Rest and stress perfusion CMR image data, however, offer the possibility to precisely quantify the effect of the MI on the myocardial blood flow, allowing thus for a superior personalization of the CFD and/or DL model (e.g. using the neural network system 100) used for determining stress/rest hemodynamic indices. Such an assessment is most effectively performed when integrating the interpretation of the rest and stress perfusion CMR images with that of LGE images to evaluate for ischemia and prior MI (e.g. by extending the qualitative visual interpretation algorithm of Klem I et al. in "Improved detection of coronary artery disease by stress perfusion cardiovascular magnetic resonance with the use of delayed enhancement infarction imaging", J Am Coll Cardiol. 2006 Apr. 18; 47(8):1630-8).

A defect seen on the stress perfusion CMR images, which normalizes in intensity on the rest perfusion CMR images without associated LGE, is defined as ischemic. A perfusion defect which is matched with LGE images can be described as 'fixed defect' or 'scar', as for example reviewed by P. D. Filev and A. E. Stillman in "Long-Term Prognostic Value of Stress Perfusion Cardiovascular Magnetic Resonance Imaging", Curr Treat Options Cardiovasc Med. 2019 Aug. 31; 21(10):51.

In the following, a fifth embodiment of the neural network system 100 is described, which is combinable with any other embodiment. The determination of the at least one cardiac metric performed (e.g. at reference sign 308 in FIG. 3) by the neural network system 100 may have a lower accuracy for rare cases, e.g. for complex pathological configurations, than for healthy patients. To ensure good performance and robust estimations for such rare cases, the training database may be artificially augmented to ensure that the rare cases are well sampled during the training phase.

A use of synthetic data during the training phase may provide several advantages including a very large number of cases and/or pathological configuration that can be automatically generated, leading to an extensive database. Further advantages include that rare pathological cases can be sampled better (e.g. at a larger percentage than within real datasets) and that complex pathological configurations (e.g. comprising multiple cardiac pathologies) may be generated.

A still further advantage of using synthetic data for training is that as the generation of synthetic data can be (e.g. completely) automated, the cost of generating a large database is reduced as compared to the acquisition of real data.

A very popular generative approach is based on GANs. An example of a cycle GAN is provided in FIG. 4. The cycle GAN is generally referred by the reference sign 400.

The main idea behind a GAN, e.g. the cycle GAN 400, is that a generator 408 tries to generate realistic synthetic data 402-A, 402-B, and a discriminator 410 learns to distinguish between synthetic data 402-A, 402-B and real data 404-A, 404-B (e.g. the rest and stress perfusion CMR images and the LGE images at reference signs 302, 304 and 306 in FIG. 3, respectively). An advantageous implementation makes use of a style transfer, e.g. using a cycle GAN 400. Style transfer has for example been used by Jun-Yan Zhu et al. in "Unpaired Image-to-Image Translation using Cycle-Consistent Adversarial Networks", https://arxiv.org/abs/1703.10593 to transform between labels and (e.g. scenery and/or nature) photos.

Figure 4:
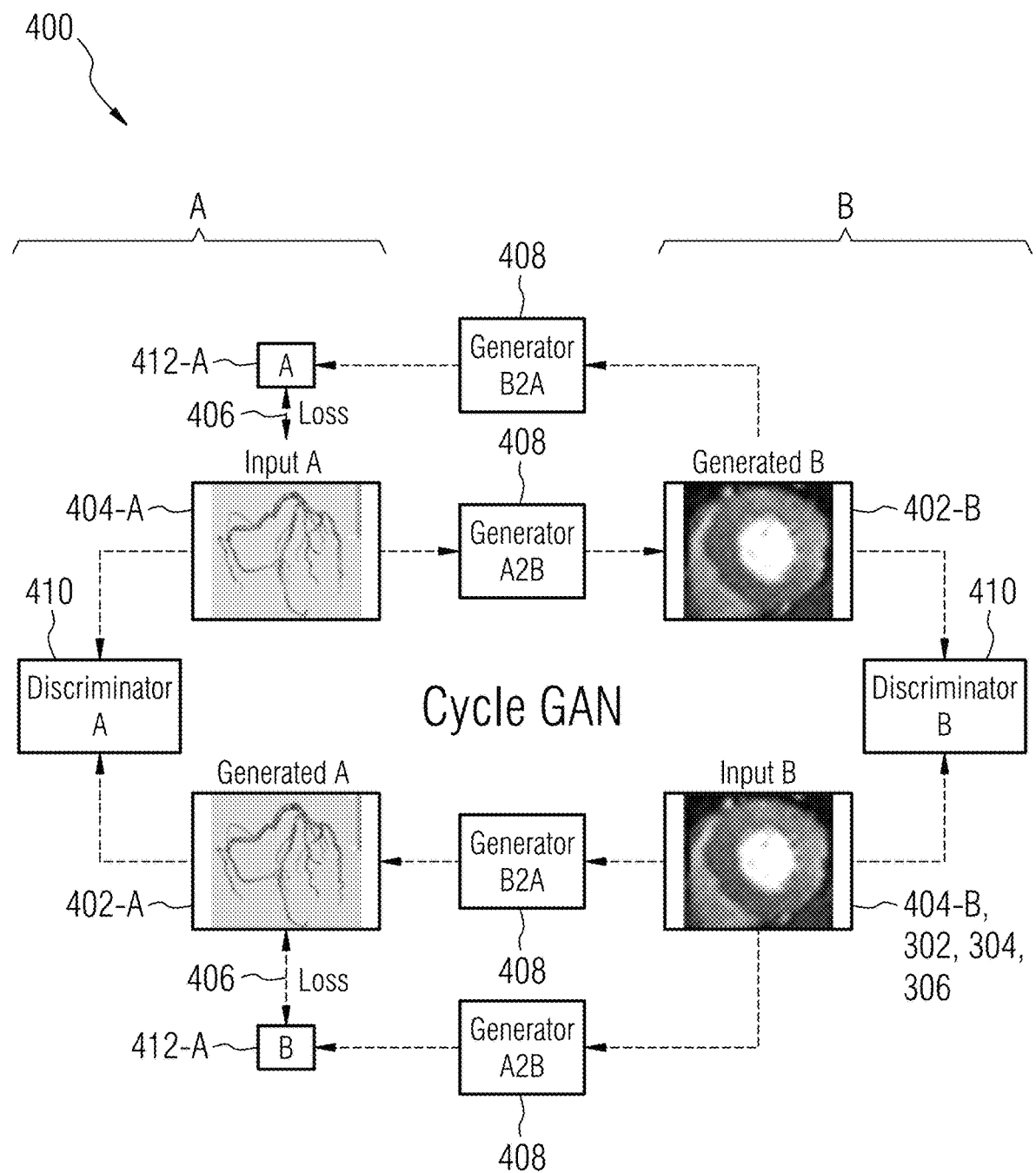
FIG. 4 shows an example schematic block diagram of a cycle GAN, which may be implementable for training in the neural network system of FIG. 1.

The cycle GAN 400 in FIG. 4 comprises two domains A and B. Coronary arterial trees 402-A, 404-A with corresponding hemodynamic index information (e.g. FFR measured invasively or determined using a DL/CFD model; in the latter case the coronary arterial tree 402-A itself may be a synthetically generated one) are comprised in domain A. Perfusion CMR images 402-B, 404-B (e.g. rest and stress perfusion CMR images 302, 304 and LGE images 306) are comprised in domain B. The goal of the GAN 400 is to be able to transfer the style both from domain A to B, and from domain B to A. By the style transfer, further synthetic data 412-A are generated, and a loss 406 is determined relative to the real data 404-A and/or synthetic data 402-A. The cycle GAN 400 is trained by minimizing the loss 406 over multiple (e.g. several hundred) cycles.

In the following a sixth embodiment, which is combinable with any other embodiment, is described in connection with FIG. 5. The neural network system 100 may be employed as part of a clinical decision support system. The relative and/or absolute CMR stress/rest perfusion values allow for a flow based coronary assessment which is similar to that of CFR. By employing the approach described above, e.g. in connection with FIG. 3, FFR may, in addition to CFR, be determined from the rest and stress perfusion CMR image data, allowing for a comprehensive CAD diagnosis.

Figure 5:
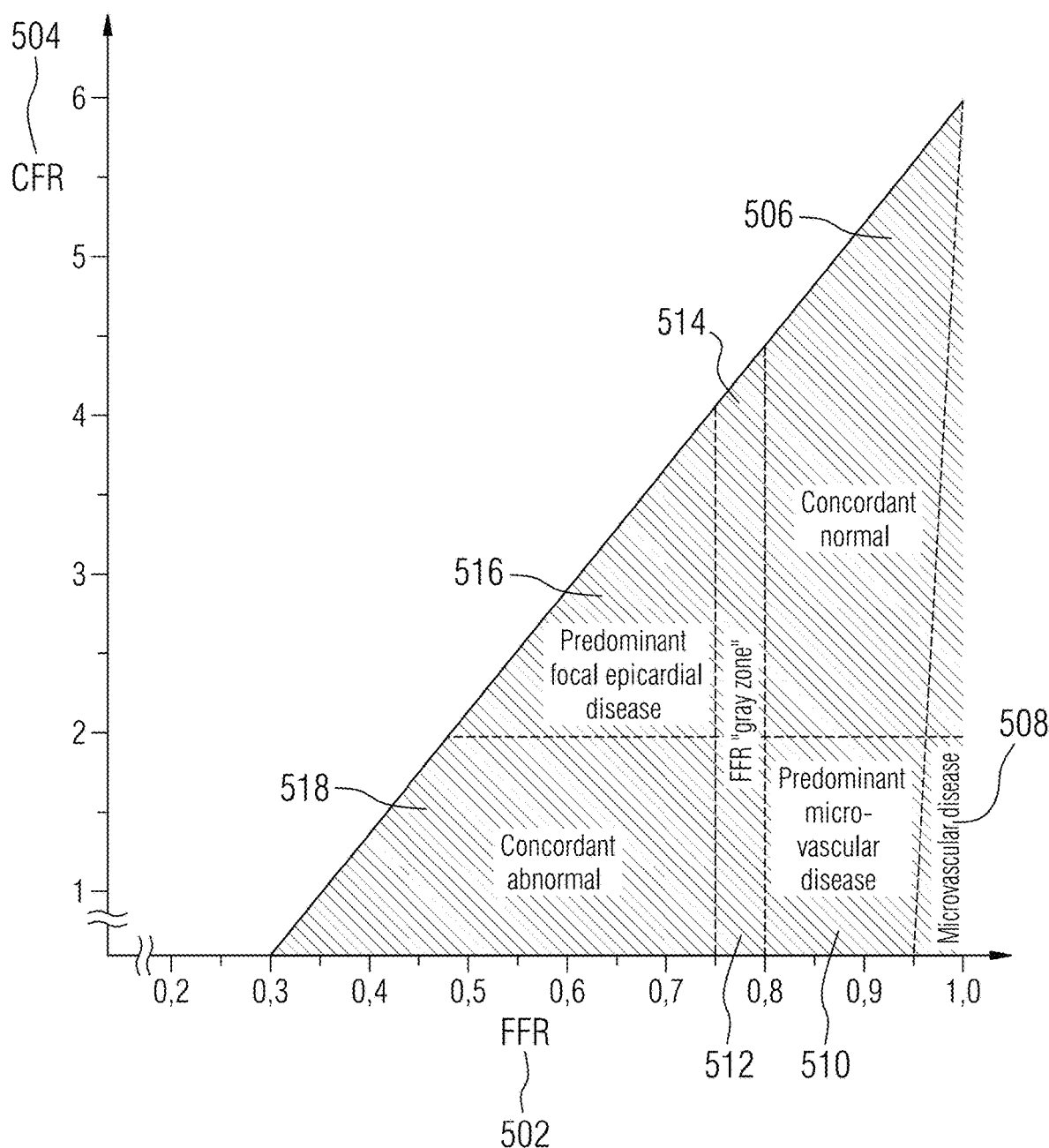
FIG. 5 shows an example joint classification of two different hemodynamic indices, FFR and CFR, for a patient-wise functional assessment.

FIG. 5 comprises a reproduction of FIG. 1 by T. P. van de Hoef et al. in "Physiological basis and long-term clinical outcome of discordance between fractional flow reserve and coronary flow velocity reserve in coronary stenoses of intermediate severity". Circ Cardiovasc Interv. 2014; 7(3): 301-311. 38.

Four main quadrants can be identified by applying the clinically applicable cutoff values for FFR at reference sign 502 and CFR at reference sign 504, the cutoffs indicated by the dotted lines. Patients in the upper right area 506 are characterized by concordantly normal FFR 502 and CFR 506, and patients in the lower-left area 518 are characterized by concordantly abnormal FFR 502 and CFR 504. Patients in the upper-left area 516 and lower-right area 510 are characterized by discordant results between FFR 502 and CFR 504: combination of an abnormal FFR 502 and a normal CFR 504 indicates predominant focal epicardial but non-flow-limiting CAD at reference sign 516, and the combination of a normal FFR 502 and an abnormal CFR 504 indicates predominant microvascular involvement in CAD at reference sign 510. The small region 508 in the lower right is characterized by an FFR 502 near one and an abnormal CFR 504, indicating sole involvement of the coronary microvasculature. The region indicated by reference signs 512 and 514 is denoted as FFR 'gray zone'.

Using the estimated values of CFR 504 and FFR 502, an ML algorithm (e.g. implementable in the neural network system 100) may be trained to predict a clinical decision. In the following, we refer to the measure of interest to be predicted by the ML algorithm, i.e. the clinical decision to be determined and/or recommended.

The clinical decision may be a binary decision. The clinical decision may e.g. comprise if a patient is to be sent to the cath lab and/or to prescribe only optimal medical treatment. Alternatively or in addition, the clinical decision may be a continuous variable, like the date of a future screening exam. Further alternatively or in addition, in case of more than two options a multiple option choice may be performed (e.g. using a multi-class classifier).

Each decision may be followed by more fine-grade options of that decision. For example, if the decision is to send the patient home, the neural network system 100 may be further employed to decide which type of medication to prescribe and/or when the patient should return for a follow-up and/or screening exam.

The proposed algorithm performed by the neural network system 100 may produce as a result (also: 'clinical decision') either an absolute value (e.g. with probability=1) or a set of probabilities for each decision.

The clinical decisions may be defined at patient level or at branch and/or lesion level (e.g. per main coronary artery LAD, LCx or RCA).

Figure 6:
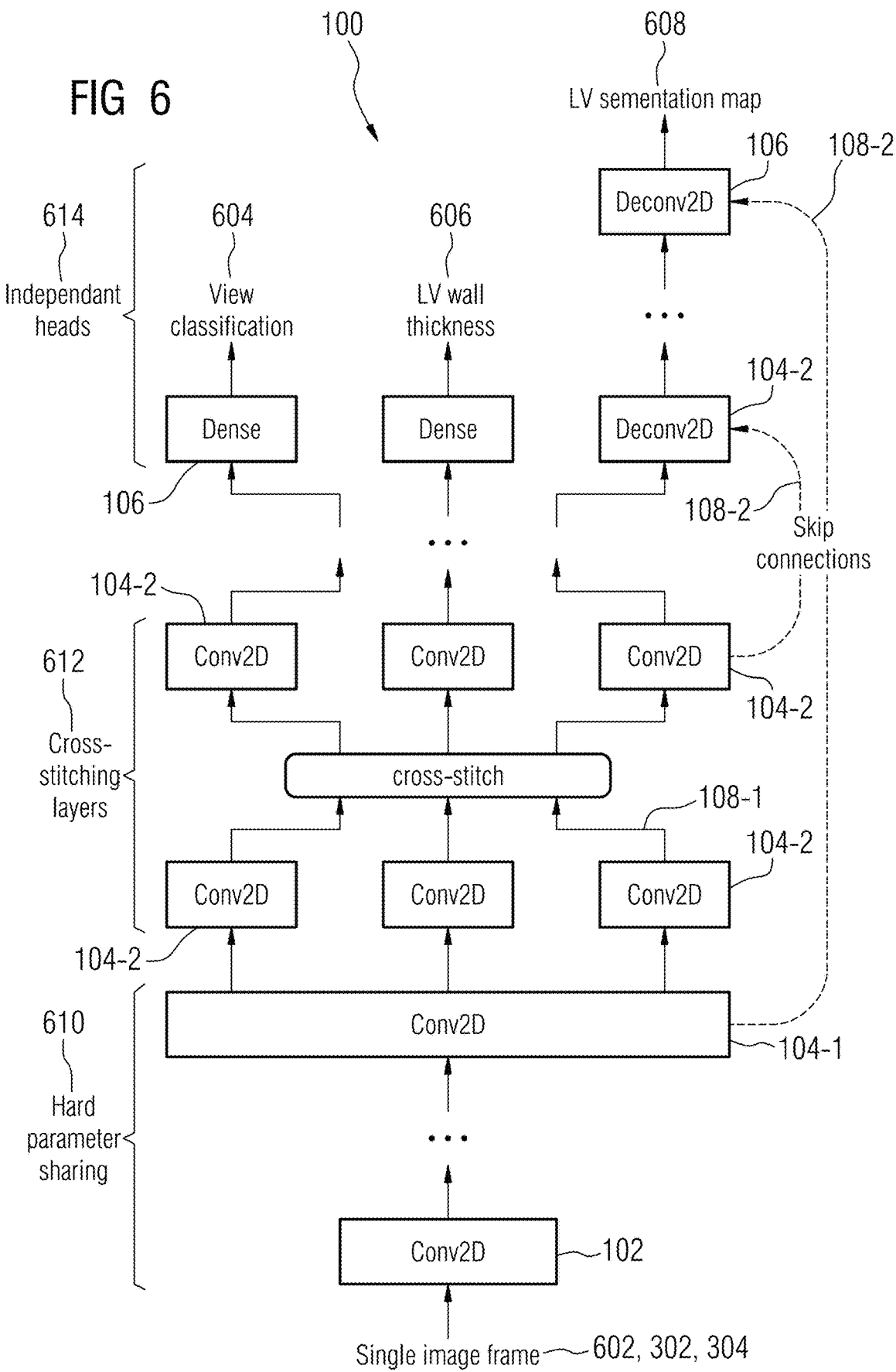
FIG. 6 shows an example block diagram of a neural network system for determining up to three different cardiac metrics from rest and stress perfusion CMR images using cross-stitching hidden layers, which neural network system may be implementable by the neural network system of FIG. 1.

An exemplary embodiment of a multi-task learning neural network system 100 is FIG. 6 comprising a multi-task learning architecture which takes as input a single CMR image frame (e.g. a stack of CMR images comprising rest and/or stress perfusion CMR images 302 and 304, respectively, taken over one or more cardiac cycles) at reference sign 602 and outputs three values of interest: a view classification at reference sign 604, an LV segmentation at reference sign 606 and an LV wall thickness at reference sign 608. The three outputs 604, 606 and 608 are of heterogenous types: a class probability distribution (view classification 604), a classification segmentation image (LV segmentation 606) and a regression value (LV wall thickness 608), respectively. The three outputs 604, 606 and 608 can share intermediate representations of the input data 602 (e.g. the rest and stress perfusion CMR images 302 and 304, respectively). The inductive bias from one task can prove beneficial for the other tasks.

The first convolutional layers (e.g. the input layer 102 and one or more hidden layers 104-1) of the neural network system 100 in FIG. 6 are hard-shared, meaning the same activations at reference sign 610 will feed the three (e.g. task-specific) network heads 614. As the number of layers 104-1 increases, their receptive field increases and the output feature maps size usually decreases, therefore learning more complex feature representations. However, even though the tasks share structure, in order to maximize performance, it may be necessary that higher level features become more task specific.

A good way to let the network couple/decouple task-specific features is the use of (e.g. a sub-network comprising) cross-stitching layers 104-2 at reference sign 612. I. Misra et al. provide an exemplary introduction to cross-stitching networks in "Cross-Stitch Networks for Multi-task Learning," 2016 IEEE Conference on Computer Vision and Pattern Recognition (CVPR), Las Vegas, N V, 2016, pp. 3994-4003, doi: 10.1109/CVPR.2016.433.

Several cross-stitching layers 104-2 are used to create the high-level features for each task, while adaptively sharing information between network heads 106, e.g. by means of cross-stitching connections 108-1 and/or skip interconnections 108-2.

After a sufficient receptive field of view is attained (or a sufficient network/feature complexity) through the convolutional layers 104-1 and 104-2, for the view classification 604 and for the LV wall thickness 606 tasks the usage of several dense layers 104-2, 106 may prove sufficient for the final parts of the two network heads 614. However, for the LV segmentation task at reference sign 608, skip connections 108-2 may be required to improve the segmentation accuracy.

The final loss function is a weighted sum of three loss components: a categorical-cross entropy loss, a mean squared error (MSE) loss and a DICE loss. Due to the different nature of the loss components, special care in selecting the loss weights is needed. A wrong choice may lead to some task(s) being underperformer(s). An adaptive loss components weighting scheme has for example been proposed by R. Cipolla et al. in "Multi-task Learning Using Uncertainty to Weigh Losses for Scene Geometry and Semantics," 2018 IEEE/CVF Conference on Computer Vision and Pattern Recognition, Salt Lake City, UT, 2018, pp. 7482-7491, doi: 10.1109/CVPR.2018.00781, which can alleviate the problem of selecting the proper loss weights.

Figure 7:
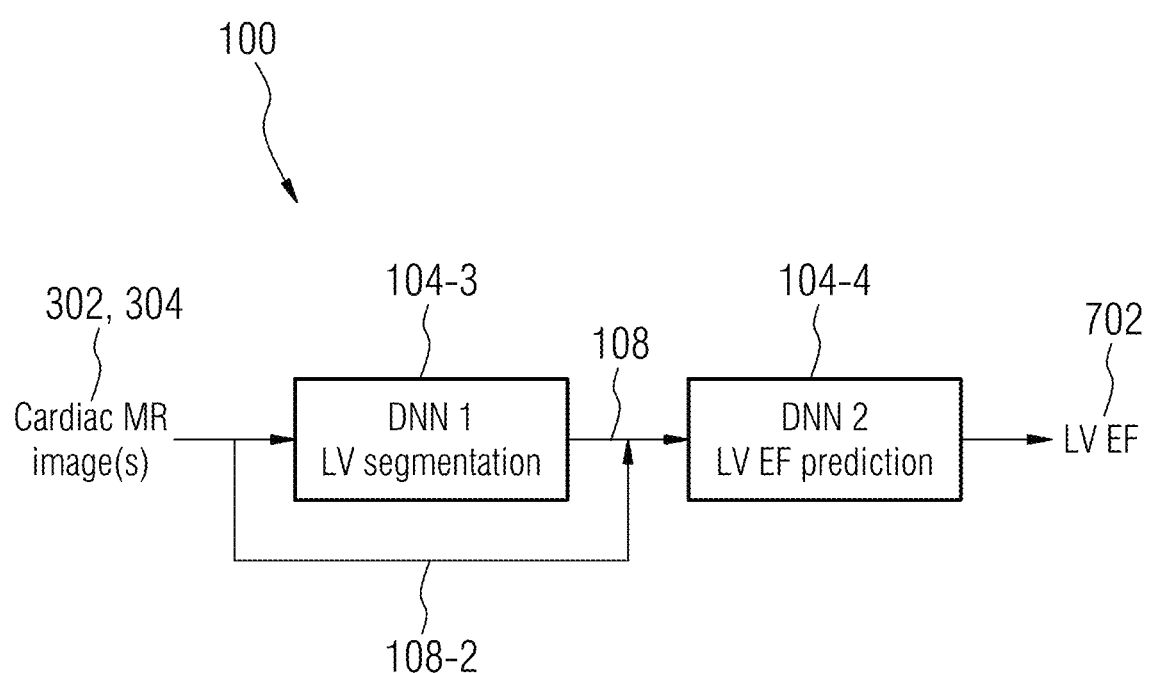
FIG. 7 shows an example block diagram of a neural network system for determining two different cardiac metrics from rest and stress perfusion CMR images using cascaded hidden layers, which neural network system may be implementable by the neural network system of FIG. 1.

FIG. 7 shows an example of a cascaded deep neural network comprised in the neural network system 100. The first sub-network (DNN 1 at reference sign 104-3) performs a segmentation of the LV, while the second sub-network (DNN 2 at reference sign 104-4) determines the LV-EF at reference sign 702. The second sub-network 104-4 takes as input both the CMR images (at reference sign 108-2) and the segmentations generated by the first sub-network 104-3 (at reference sign 108).

By the neural network system, method and computer program product as disclosed herein, a way to perform lesion-specific and/or automated quantification of CAD in routine (e.g. rest and stress) perfusion CMR imaging is provided.

Conventional solutions comprise a visual and/or semi-quantitative analysis of perfusion. However, a lesion-specific quantification of CAD is not possible with the conventional methods.

The neural network system, method and computer program product disclosed herein may be combined with any CMR product and/or CMR apparatus such as syngo via, inline/Numaris, DOT Engine. For example, business units DI MR, DI DH might make use of the technique as disclosed herein.

Many advantages of the present invention will be fully understood from the foregoing description, and it will be apparent that various changes may be made in the form, construction and arrangement of (e.g. the sub-networks of) the neural network system and the associated method without departing from the scope of the invention and/or without sacrificing all of its advantages. Since the invention can be varied in many ways, it will be recognized that the invention should be limited only by the scope of the following claims.

LIST OF ABBREVIATIONS

ASIC Application-Specific Integrated Circuit
BSR Basal Stenosis Resistance
CAD Coronary Artery Disease
CCTA Cardiac Computed Tomography Angiography
CFD Computational Fluid Dynamics
CFR Coronary Flow Reserve
CFVR Coronary Flow Velocity Reserve
CMR Cardiac Magnetic Resonance
DFR Diastolic Hyperemia-Free Ratio
DL Deep Learning
ED End-Diastolic/End-Diastole
EF Ejection Fraction
ES End-Systolic/End-Systole
FFR Fractional Flow Reserve
FPGA Field-Programmable Gate Array
GAN Generative Adversarial Network
GNN Graph Neural Network
HSR Hyperemic Stenosis Resistance
IFR Instant Flow Reserve
IMR Index of Microcirculatory Resistance
LAD Left Anterior Descending Artery
LCx Left Circumflex artery
LGE Late Gadolinium Enhancement
LV Left Ventricular/Left Ventricular
MACE Major Adverse Cardiac Event
MBF Myocardial Blood Flow
MBV Myocardial Blood Volume
MI Myocardial Infarction
ML Machine Learning
MRI Magnetic Resonance Imaging
MSE Mean Squared Error
Pd/Pa distal intracoronary Pressure/aortic Pressure
RCA Right Coronary Artery
RV Right Ventricular/Right Ventricle
WMSI Wall Motion Score Index

The invention claimed is:

1. A neural network system for determining at least two cardiac metrics from cardiac magnetic resonance (CMR) images, the neural network system comprising:
   an input layer configured to receive at least one CMR image representative of a rest perfusion state and at least one CMR image representative of a stress perfusion state; and
   an output layer configured to output at least two different cardiac metrics based on the at least one CMR image representative of the rest perfusion state and the at least one CMR image representative of the stress perfusion state,
   wherein the neural network system with interconnections between the input layer and the output layer is trained by multi-task learning using a plurality of datasets, each of the datasets comprising an instance of the at least one CMR image representative of the rest perfusion state and the at least one CMR image representative of the stress perfusion state for the input layer and the at least two different cardiac metrics for the output layer,
   wherein the neural network system comprises at least two sub-networks corresponding to the at least two different cardiac metrics, and
   wherein the interconnections comprise cross-connections between the at least two sub-networks at the input layer and/or at least one hidden layer between the input layer and the output layer.

2. The neural network system of claim 1, wherein the at least two different cardiac metrics comprise at least one of:
   a hemodynamic index;
   a linear size of a heart chamber;
   a volumetric size of a heart chamber;
   a mass of a heart chamber;
   a myocardial elasticity; and
   a motion pattern.

3. The neural network system of claim 2, wherein the hemodynamic index comprises at least one of:
   a fractional flow reserve (FFR);
   an instantaneous flow reserve (IFR);
   a distal intracoronary pressure (Pd) and an aortic pressure (Pa);
   a ratio Pd/Pa;
   a diastolic hyperemia-free ratio (DFR);
   a coronary flow reserve (CFR);
   an index of microcirculatory resistance (IMR);
   a hyperemic stenosis resistance (HSR); and
   a basal stenosis resistance (BSR).

4. The neural network system of claim 1, wherein the input layer of the neural network system is further configured to receive at least one of:
   at least one image representative of late gadolinium enhancement (LGE);
   data representative of a prior medical examination; and
   at least one further CMR image representative of a strain analysis.

5. The neural network system of claim 1, wherein the output is heterogeneous and comprises at least one of:
   a pixel-wise output of the at least two different cardiac metrics, wherein pixels of the pixel-wise output correspond to pixels of the at least one CMR image representative of the rest perfusion state and the at least one CMR image representative of the stress perfusion state;
   a segment-wise output of the at least two different cardiac metrics, wherein segments of the segment-wise output correspond to a segmentation of myocardium based on the at least one CMR image representative of the rest perfusion state and on the at least one CMR image representative of the stress perfusion state;

an output of the at least two different cardiac metrics for each of the main coronary arteries, wherein the main coronary arteries comprise a left anterior descending artery (LAD), a left circumflex artery (LCx), and a right coronary artery (RCA); and a patient-wise output of the at least two different cardiac metrics comprising a joint classification of the at least two different cardiac metrics.

6. The neural network system of claim 1, wherein the at least two different cardiac metrics comprise a fractional flow reserve (FFR) and a coronary flow reserve (CFR), and wherein a joint classification of the CFR and the FFR corresponds to a lesion-specific classification of coronary artery disease (CAD) at the output layer.

7. The neural network system of claim 1, wherein the neural network system is trained and/or each of the at least two different cardiac metrics is output by assigning a different labeling function to each of the at least two different cardiac metrics.

8. The neural network system of claim 7, wherein each of the labeling functions comprises an abstain value, wherein the abstain value is assigned if at least one of:
no input data are available for the labeling function; and
the output does not comprise a decisive value.

9. The neural network system of claim 1, wherein the interconnections of the neural network system comprise at least one of:
at least one hidden layer for jointly processing the at least one CMR image representative of the rest perfusion state and the at least one CMR image representative of the stress perfusion state for outputting the at least two different cardiac metrics, wherein the at least one hidden layer for jointly processing is consecutive to the input layer receiving the at least one CMR image representative of the rest perfusion state and the at least one CMR image representative of the stress perfusion state, and wherein the at least one hidden layer comprises a convolutional layer;
at least two hidden layers for separately processing the at least one CMR image representative of the rest perfusion state and the at least one CMR image representative of the stress perfusion state for outputting the at least two different cardiac metrics, wherein the at least two hidden layers for separately processing are subject to a similarity constraint and/or wherein the at least two hidden layers for separately processing have approximately the same distance from the output layer, wherein the distance from the output layer is measured as the minimal number of interconnections of the different layers; or
at least two hidden layers for processing the at least one CMR image representative of the rest perfusion state and the at least one CMR image representative of the stress perfusion state for outputting the at least two different cardiac metrics, wherein a first hidden layer processes the at least one CMR image representative of the rest perfusion state and the at least one CMR image representative of the stress perfusion state for a first cardiac metric and a second hidden layer processes the at least one CMR image representative of the rest perfusion state and the at least one CMR image representative of the stress perfusion state for a second cardiac metric, wherein the processing at the second hidden layer further comprises using the output of the first hidden layer as input in addition to the input of the at least one CMR image representative of the rest perfusion state and the at least one CMR image representative of the stress perfusion state.

10. The neural network system of claim 1, wherein the neural network system is trained and/or the at least two different cardiac metrics are output by at least one of the following steps:
adapting a coronary artery anatomical model to anatomical images;
mapping of the adapted coronary artery anatomical model to the at least one CMR image representative of the rest perfusion state and the at least one CMR image representative of the stress perfusion state;
determining of at least one hemodynamic index of at least one main coronary artery; and
determining a perfusion of myocardium using a coronary perfusion model.

11. The neural network system of claim 1, wherein the neural network system comprises a graph neural network (GNN).

12. The neural network system of claim 1, the plurality of datasets comprising real datasets and synthetic datasets, wherein the neural network system is trained by generating the synthetic datasets.

13. A computer-implemented method of determining at least two cardiac metrics from cardiac magnetic resonance (CMR) images using a neural network system, the method comprising the steps of:
receiving, at an input layer, at least one CMR image representative of a rest perfusion state and at least one CMR image representative of a stress perfusion state; and
outputting, at an output layer, at least two different cardiac metrics based on the at least one CMR image representative of the rest perfusion state and the at least one CMR image representative of the stress perfusion state;
wherein the neural network system with interconnections between the input layer and the output layer is trained by multi-task learning using by a plurality of datasets, each of the datasets comprising an instance of the at least one CMR image representative of the rest perfusion state and the at least one CMR image representative of the stress perfusion state for the input layer and the at least two different cardiac metrics for the output layer,
wherein the neural network system comprises at least two sub-networks corresponding to the at least two different cardiac metrics, and
wherein the interconnections comprise cross-connections between the at least two sub-networks at the input layer and/or at least one hidden layer between the input layer and the output layer.

14. The computer-implemented method of claim 13, wherein the at least two different cardiac metrics comprise at least one of:
a hemodynamic index;
a linear size of a heart chamber;
a volumetric size of a heart chamber;
a mass of a heart chamber;
a myocardial elasticity; and
a motion pattern.

15. The computer-implemented method of claim 13, wherein the input layer of the neural network system is further configured to receive at least one of:
at least one image representative of late gadolinium enhancement (LGE);

data representative of a prior medical examination; and
at least one further CMR image representative of a strain analysis.

16. The computer-implemented method of claim 13, wherein the neural network system is trained and/or the at least two different cardiac metrics are output by at least one of the following steps:
adapting a coronary artery anatomical model to anatomical images;
mapping of the adapted coronary artery anatomical model to the at least one CMR image representative of the rest perfusion state and the at least one CMR image representative of the stress perfusion state;
determining of at least one hemodynamic index of at least one main coronary artery; and
determining a perfusion of myocardium using a coronary perfusion model.

17. The computer-implemented method of claim 13, wherein the neural network system comprises a graph neural network (GNN).

18. The computer-implemented method of claim 13, wherein the neural network system is trained and/or each of the at least two different cardiac metrics is output by assigning a different labeling function to each of the at least two different cardiac metrics.

19. The computer-implemented method of claim 13, wherein the interconnections of the neural network system comprise at least one of:
at least one hidden layer for jointly processing the at least one CMR image representative of the rest perfusion state and the at least one CMR image representative of the stress perfusion state for outputting the at least two different cardiac metrics, wherein the at least one hidden layer for jointly processing is consecutive to the input layer receiving the at least one CMR image representative of the rest perfusion state and the at least one CMR image representative of the stress perfusion state, and wherein the at least one hidden layer comprises a convolutional layer;
at least two hidden layers for separately processing the at least one CMR image representative of the rest perfusion state and the at least one CMR image representative of the stress perfusion state for outputting the at least two different cardiac metrics, wherein the at least two hidden layers for separately processing are subject to a similarity constraint and/or wherein the at least two hidden layers for separately processing have approximately the same distance from the output layer, wherein the distance from the output layer is measured as the minimal number of interconnections of the different layers; or
at least two hidden layers for processing the at least one CMR image representative of the rest perfusion state and the at least one CMR image representative of the stress perfusion state for outputting the at least two different cardiac metrics, wherein a first hidden layer processes the at least one CMR image representative of the rest perfusion state and the at least one CMR image representative of the stress perfusion state for a first cardiac metric and a second hidden layer processes the at least one CMR image representative of the rest perfusion state and the at least one CMR image representative of the stress perfusion state for a second cardiac metric, wherein the processing at the second hidden layer further comprises using the output of the first hidden layer as input in addition to the input of the at least one CMR image representative of the rest perfusion state and the at least one CMR image representative of the stress perfusion state.

20. A non-transitory computer readable medium storing computer program instructions for determining at least two cardiac metrics from cardiac magnetic resonance (CMR) images using a neural network system, the computer program instructions when executed by a processor cause the processor to perform operations comprising:
an input layer configured to receive at least one CMR image representative of a rest perfusion state and at least one CMR image representative of a stress perfusion state; and
an output layer configured to output at least two different cardiac metrics based on the at least one CMR image representative of the rest perfusion state and the at least one CMR image representative of the stress perfusion state,
wherein the neural network system with interconnections between the input layer and the output layer is trained by multi-task learning using a plurality of datasets, each of the datasets comprising an instance of the at least one CMR image representative of the rest perfusion state and the at least one CMR image representative of the stress perfusion state for the input layer and the at least two different cardiac metrics for the output layer,
wherein the neural network system comprises at least two sub-networks corresponding to the at least two different cardiac metrics, and
wherein the interconnections comprise cross-connections between the at least two sub-networks at the input layer and/or at least one hidden layer between the input layer and the output layer.

21. The non-transitory computer readable medium of claim 20, wherein the output is heterogeneous and comprises at least one of:
a pixel-wise output of the at least two different cardiac metrics, wherein pixels of the pixel-wise output correspond to pixels of the at least one CMR image representative of the rest perfusion state and the at least one CMR image representative of the stress perfusion state;
a segment-wise output of the at least two different cardiac metrics, wherein segments of the segment-wise output correspond to a segmentation of myocardium based on the at least one CMR image representative of the rest perfusion state and on the at least one CMR image representative of the stress perfusion state;
an output of the at least two different cardiac metrics for each of the main coronary arteries, wherein the main coronary arteries comprise a left anterior descending artery (LAD), a left circumflex artery (LCx), and a right coronary artery (RCA); and
a patient-wise output of the at least two different cardiac metrics comprising a joint classification of the at least two different cardiac metrics.

22. The non-transitory computer readable medium of claim 20, wherein the at least two different cardiac metrics comprise a fractional flow reserve (FFR) and a coronary flow reserve (CFR), and wherein a joint classification of the CFR and the FFR corresponds to a lesion-specific classification of coronary artery disease (CAD) at the output layer.

23. The non-transitory computer readable medium of claim 20, wherein the neural network system is trained and/or each of the at least two different cardiac metrics is output by assigning a different labeling function to each of the at least two different cardiac metrics.

24. The non-transitory computer readable medium of claim 20, wherein the interconnections of the neural network system comprise at least one of:

- at least one hidden layer for jointly processing the at least one CMR image representative of the rest perfusion state and the at least one CMR image representative of the stress perfusion state for outputting the at least two different cardiac metrics, wherein the at least one hidden layer for jointly processing is consecutive to the input layer receiving the at least one CMR image representative of the rest perfusion state and the at least one CMR image representative of the stress perfusion state, and wherein the at least one hidden layer comprises a convolutional layer;
- at least two hidden layers for separately processing the at least one CMR image representative of the rest perfusion state and the at least one CMR image representative of the stress perfusion state for outputting the at least two different cardiac metrics, wherein the at least two hidden layers for separately processing are subject to a similarity constraint and/or wherein the at least two hidden layers for separately processing have approximately the same distance from the output layer, wherein the distance from the output layer is measured as the minimal number of interconnections of the different layers; or
- at least two hidden layers for processing the at least one CMR image representative of the rest perfusion state and the at least one CMR image representative of the stress perfusion state for outputting the at least two different cardiac metrics, wherein a first hidden layer processes the at least one CMR image representative of the rest perfusion state and the at least one CMR image representative of the stress perfusion state for a first cardiac metric and a second hidden layer processes the at least one CMR image representative of the rest perfusion state and the at least one CMR image representative of the stress perfusion state for a second cardiac metric, wherein the processing at the second hidden layer further comprises using the output of the first hidden layer as input in addition to the input of the at least one CMR image representative of the rest perfusion state and the at least one CMR image representative of the stress perfusion state.

* * * * *